United States Patent [19]

Moitie et al.

[11] Patent Number: 5,444,391

[45] Date of Patent: Aug. 22, 1995

[54] TIE-UP AND TIE-DOWN CIRCUITS WITH A PRIMARY INPUT FOR TESTABILITY IMPROVEMENT OF LOGIC NETWORKS

[75] Inventors: Richard Moitie, Fleury-En-Biere; Jean-Marie Rolland, Corbeil Essonnes; Jacques Renard, Pontierry, all of France

[73] Assignee: International Business Machines Corporation, Armonk, N.Y.

[21] Appl. No.: 195,227

[22] Filed: Feb. 14, 1994

[30] Foreign Application Priority Data

Apr. 29, 1993 [EP] European Pat. Off. ........... 93480049

[51] Int. Cl.6 ..................... G06F 7/38; H03K 19/173
[52] U.S. Cl. ........................... 326/16; 326/38; 371/22.5
[58] Field of Search ............ 307/465, 443, 451; 326/38, 47, 21, 121, 16; 371/22.5, 22.6, 24

[56] References Cited

U.S. PATENT DOCUMENTS

| | | | |
|---|---|---|---|
| 4,758,746 | 7/1988 | Birkner | 307/465 |
| 4,780,628 | 10/1988 | Illman | 307/465 |
| 4,812,678 | 3/1989 | Abe | 307/443 |
| 5,023,485 | 6/1991 | Sweeney | 307/465 |
| 5,250,854 | 10/1993 | Lien | 307/296.1 |

OTHER PUBLICATIONS

A. Motohara, et al., "Design for Testability for Complete Test Coverage" 8219 IEEE Design & Test of Computers, pp. 25–32, Nov. 1984.

Dick L. Liu, et al., "A CMOS PLA Design for Built–In Self–Test" vol. 3 1977 IEEE Inter. Symp. on Circuits & Systems, pp. 859–862, May 1987.

Anonymous, "Off Chip Receiver for Multi–Chip Module Testing" Research Disclosure Bulletin, vol. 285, #50, p. 41, Jan. 1988.

*Primary Examiner*—Edward P. Westin
*Assistant Examiner*—Stephen Calogero
*Attorney, Agent, or Firm*—Charles W. Peterson, Jr.

[57] ABSTRACT

A semiconductor product logic chip (20) including a logic network (27-1) to be fed by a tie-up/tie down circuit (21-1). A tie-up/tie-down circuit is comprised of a non-inverting buffer book (22-1) whose input terminal (23-1) is controlled from the outside by a connection (25) to a primary input terminal (24) of the said chip. Its output terminal (26-1) is connected to said logic network. The primary input terminal is connected to a voltage supply means (29) capable of supplying a constant supply voltage VDD/GND in the SYSTEM mode and a supply voltage varying between VDD and GND, during the TEST mode. When the chip operates in the SYSTEM mode, the supply voltage means is the VDD/GND power supply, so that the primary input terminal is directly tied to the VDD/GND power supply. As a result, the tie-up/tie-down circuit generates a steady logic level "1"/"0" on its output terminal. Unlike, in the TEST mode, the voltage supply means consists of the tester generator so that the tie-up/tie-down circuit follows the tester stimuli sequence. As a result, the output terminal of the tie-up/tie-down circuit switches between the "1" and "0" logic levels depending on the tester stimuli. This allows the tester to detect all the stuck-at faults in the logic network. In this mode, the tie-up/tie-down function is not realized, since its output terminal is set to either the "0" and "1" logic levels.

4 Claims, 1 Drawing Sheet

TIE-UP AND TIE-DOWN CIRCUITS WITH A PRIMARY INPUT FOR TESTABILITY IMPROVEMENT OF LOGIC NETWORKS

FIELD OF THE INVENTION

The present invention relates to the testing of semiconductor logic product chips including numerous complex logic networks for carrying on data processing operations that have "stuck-at" faults and more particularly to tie-up and tie-down circuits provided with a connection to a primary input to improve the testability of such complex logic networks, and thereby the final quality of the said semiconductor product logic chips.

BACKGROUND OF THE INVENTION

In semiconductor product logic chips, such as ASIC chips, a high level of testability is required in order to eliminate all defective parts. A test coverage of more than 99.9% is usually expected with advanced semiconductor technologies. The test coverage is function of the predicted yield and the targeted Shipped Product Quality Level (SPQL) at system level. Circuits such as tie-up and/or tie-down circuits are often used for functionality purposes in combination with combinational logic books to form complex logic networks. As a matter of fact, a short to the VDD power supply would be equivalent to a tie-up function (which generates a logic "1"), and a short to the ground (GND) power supply would be equivalent to a tie-down function (which generates a logic "0"). Admittedly, these tie-up/tie-down circuits are testability killers in some respect with the current "stuck-at" fault model because they prevent fault activation/sensitization or fault extraction. For example, if the input and/or the output of a logic book is continuously forced to a determined logic value, it cannot be completely tested. Unfortunately, the stuck-at fault model does not always correlate with the actual hardware faults, especially when the CMOS technology is employed. However, the technical community agrees to consider this model the only acceptable one to calculate efficiently the testability of the high density ASIC chips designed to date. The testability-is calculated over the "flat" structure of the complete design built from elementary logic books such as AND, NAND, OR, NOR, . . . , etc. To each input and output of these elementary books is assigned two data: one "stuck-at-1" and one "stuck-at-0". The stuck-at-1 indicates the wiring net which is connected to the input (or output) is blocked (stuck) to the logic level "1", while the stuck-at-0 indicates the wiring net is blocked to the logic level "0".

As usually known for those ordinary skilled in the art, before a product chip is shipped in a system to the customer, it is extensively tested in the manufacturing environment, during the so-called final test step. A standard product chip has thus two basic operating modes: the SYSTEM mode according to which the product chip is in normal operation in a system at customer location and the TEST mode in the manufacturing environment.

In the TEST mode, when a test configuration can sensitize one (or several) stuck-at-fault (s) and the result-can be observed for subsequent extraction by the tester on one output of the DUT (device under test), this fault is then declared detectable. Accordingly, it is removed from the list of untested faults and thus contributes to increase the score of the testability. The testability being the number of tested stuck-at faults over the total number of stuck-at faults. It is easy to realize that because the output of a tie-up (tie-down) circuit is tied to the VDD (GND) power supply, it cannot be switched to the opposite logic level to detect a-stuck-at-1 (stuck-at-0). Finally, when all the tie-up/tie-down circuits and related logic books of the said complex logic networks are interconnected, the total testability of the said complex logic networks is thus decreased. This will be explained by reference to FIG. 1, which shows a piece of a conventional complex logic network 10 and a tie-up circuit 11 associated therewith.

Now turning to FIG. 1, there are shown a logic network 10 including both combinational and sequential logic books and a tie-up circuit 11. The output (A) of said tie-up circuit 11 is connected to the first input of a logic elementary book 12, e.g. an OR-INVERTER (OI) gate, whose second input is connected to the output of a latch 13. The output (C) of book 12 is connected to one input (E) of an OR (O) gate 14 and to one input (F) of an OR-INVERTER (OI) gate 15. The test generation system creates for each input/output of each book, e.g. OI 12, a pair of stuck-at-faults (0 and 1). During the normal test operation (TEST mode) certain stuck-at faults are detected, while others, for instance those referenced by-arrows 16 to 19 in path ABCDE, cannot be sensitized and thus remain as undetected stuck-at faults.

More generally, all the logic paths controlled by either a tie-up or a tie-down circuit see their testability affected. As of today, there are two conventional approaches to implement the TEST mode. The first one is to avoid this testability impact by reducing the number of books controlled by the said tie-up/tie-down circuits. The second one consists to ignore all stuck-at faults present on the logic books affected by them.

According to the first approach, as we have said before, any stuck-at fault which can be sensitized and observed will increase the testability score. Here, as apparent from FIG. 1, for the above mentioned path ABCDE, only 50% of the stuck-at faults which are directly under the tie-up circuit 11 control are untestable due to the impossibility to generate an opposite state thereto. Consequently, one way to reduce the testability impact is therefore to reduce the number of books e.g. books 12, 14 and 15, directly controlled by the tie-up circuit 11. Same reasoning applies to tie-down circuits.

The test engineer with his fault extraction methods may point out a low testability of the functional logic network as originally designed by the logic designer, because the presence of untestable faults resulting from tie-up/tie-down circuits. As a result, the logic designer would have to spend again a lot of additional time to identify the books controlled by such tie-up/tie-down circuits and modify its original design. This is even more true in case of previous use of logic synthesis, which is very likely with present large chips. High logic and test design skills are thus required to manually change the original design. At this point of the design cycle, such changes for necessitate a manual and complex interactive process between the logic designer and the test engineer. This is a lengthy process prone to errors. In addition, the logic overhead that needs to be added to attain reduction in the number of tie-up/tie-down circuits may be substantial, then resulting in a loss in terms of-circuit density. Finally, the overall design and validation time may be quite significantly increased. It could be very difficult to find the untested faults that have been generated because of the tie-up/tie-down circuits, as current stuck-at fault detection algorithms may be limited.

According to the second approach, a new technique has been recently introduced to classify all the untested stuck-at faults due to tie-up/tie-down circuits, as IGNORED faults. These IGNORED faults do not participate to the final testability computation. This is justified by the fact that these untested stuck-at faults tend to duplicate the tie-up or tie-down function. This point is illustrated in FIG. 1 by stuck-at-1 faults 16 and 17 which duplicate the function of tie-up circuit 11.

Now the problem arises of determining whether an hardware built-in defect which creates a fault that generates a correct function in an ASIC chip when used in SYSTEM mode, must be considered as an actual fault or a fault that can be ignored. Let us assume for instance that stuck-at fault 17 is created by an hardware built-in defect (e.g. an unexpected short between interconnection line AB and the VDD supply voltage), this hardware defect duplicates the tie-up function assured by tie-up circuit 11. Should this untested stuck-at-1 fault 17 which modelizes this hardware built-in defect, be considered as an actual fault or not, and in the latter case can be thus ignored.

When the number of such IGNORED faults stays low, their testability impact is negligible and this approach seems acceptable. However, as soon as the design uses a large number of tie-up/tie-down functions, the testability computation would be in error, and the SPQL highly degraded. More generally, according to the SPQL theory, for any test sequence, product defects of the physical type (therefore including said hardware built-in defects) are divided into two categories, which in turn, define two areas: the area of detected product defects and the area of undetected product defects. The theory behind the SPQL calculation indicates that the quality of the area of undetectable product defects depends on the ratio between the detectable and undetectable product defects. The more the area of detected product defects (testable) is important, the less the area of undetected product defect non-testable will contain faults. The consequence is that one must increase the number of-detectable defects, irrespective the said product physical defects create or not functionnality faults. Finally, the overall quality of the product is improved if the stuck-at-faults controlled by the tie-up/tie-down functions are tested.

On the other hand, besides this SPQL theory, one must also take into account the consequence on the reliability of the product containing IGNORED faults. It is very likely that these physical defects represented (modellized) by these IGNORED faults, will evolve with time. For instance, a short at time of shipping the product to the customer, may become an open sometimes in its life thus creating a real failure, that can modify the functional behavior of the logic network normally operating in SYSTEM mode.

In summary, the first approach has some inconveniences because it is really a complex process. The testability could not directly reach the high expected level e.g. 99.9 % minimum, that is sought, and in turn, the SPQL will be degraded. The logic designer must add several circuits only used to improve testability (in this case, additional overhead may be quite important) or modify other circuits in the design as explained above. Or instead, according to the second approach, because the stuck-at faults are ignored, the so-called IGNORED faults, the SPQL is likewise degraded.

An illustration of these still existing difficulties are set forth in a recent article: "Designers need new ways of handling faults to build testability into today's ICs" published in Electronics World news 28 Jan. 1992 pp 29–32. In essence, this article concludes that functional testing cannot lead to a satisfactory solution of tie-up/tie-down circuit testability pursuant to the above mentioned second approach. As a result, there has been a constant need for a long time to implement a satisfactory solution from a SPQL point of view.

SUMMARY OF THE INVENTION

Basically, a tie-up (tie-down) circuit is comprised of a non-inverting buffer book whose input terminal is controlled from the outside by a connection to a primary input (PI) of the semiconductor product logic chip. Its output terminal is connected to its associated logic network. The primary input is connected to a voltage supply means capable of supplying a constant voltage in the SYSTEM mode and a varying voltage during the TEST mode. When the chip operates in the SYSTEM mode, the primary input terminal is tied to the VDD (GND) power supply, so that the tie-up (tie-down) circuit generates a steady state "1" ("0") on its output terminal, which is then available to deliver a tie-up (tie-down) function to the said logic network. Unlike, in the TEST mode, the tie-up (tie-down) circuit follows the primary input terminal which is connected to the tester, so that the output terminal of the tie-up (tie-down) circuit switches between the "1" and "0" logic levels depending on the tester stimuli. This allows the tester to detect all the stuck-at faults in the said logic network. In this TEST mode, the tie-up (tie-down) function is not realized since its output is set to either the "0" and "1" logic levels.

According to the teachings of the present invention, the major issues of the two prior art approaches cited above will be diminished. With respect to the first approach, the designer is now free to use as many tie-up/tie-down functions he/she desires, and there is no longer any contingency on the complexity of the associated logic network. With respect to the second approach, all the stuck-at faults are no longer ignored, and the SPQL is no longer improved.

OBJECTS OF THE INVENTION

Therefore, the primary object of the present invention is to provide tie-up/tie-down circuits provided with a primary input to allow their output to switch between the "0" and "1" logic levels, in order to improve the SPQL of semiconductor product chips.

It is another object of the present invention to reduce the SPQL quality degradation which results of the prior art approaches when tie-up/tie-down functions are required in complex logic networks.

It is still another object of the present invention to provide tie-up and/or tie-down circuits with a primary input that make them fully testable.

These and other objects are met by the novel tie-up and tie-down circuits of the present invention that allow full testability of complex logic networks in a semiconductor logic product chip.

The features believed to be characteristic of this invention are set forth in the claims. The invention itself, however, as well as other objects and advantages thereof, may be best understood by reference to the following detailed description of an illustrated preferred embodiment to be read in conjunction with the accompanying drawings.

Figure 3A:
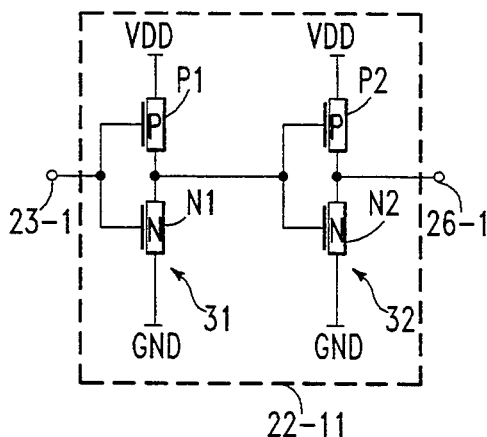
Figure 3B:
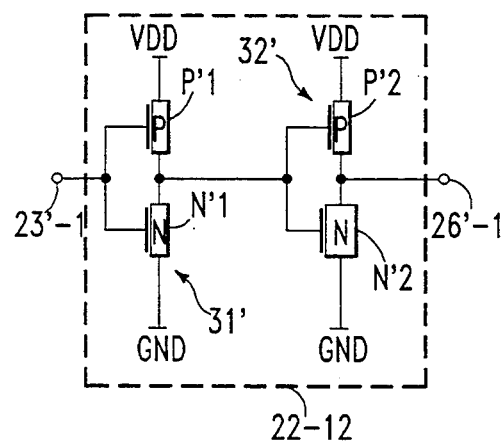

FIGS. 3A and 3B respectively illustrate typical implementations of tie-up circuit and tie-down circuits in a standard CMOS technology.

TECHNICAL DESCRIPTION OF THE INVENTION

Figure 1:
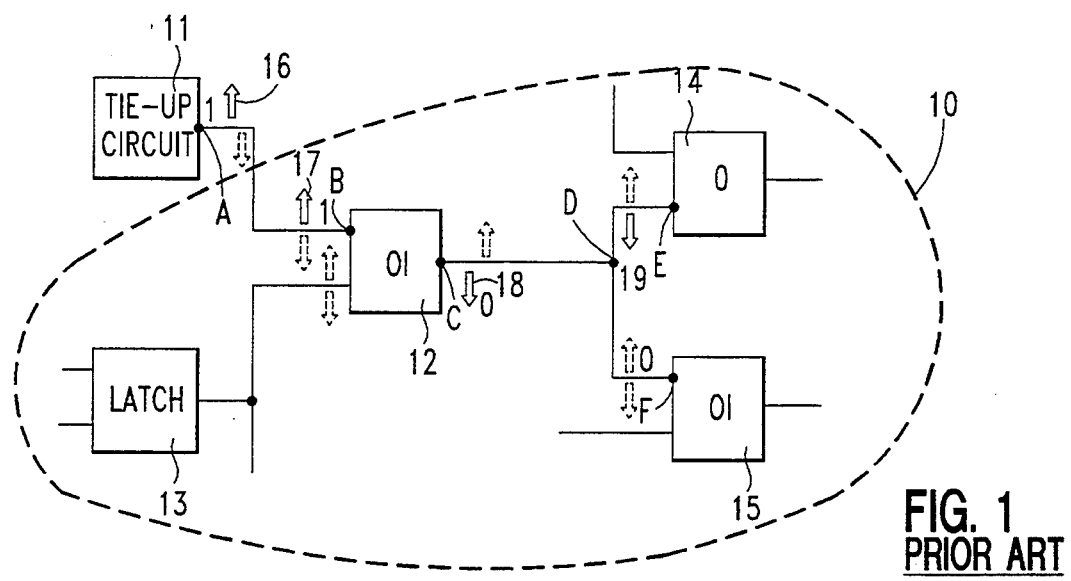
FIG. 1 illustrates the impact of the logical implementation of a tie-up circuit with respect to a piece of a conventional logic network in order to introduce the stuck at faults related problems.
Figure 2:
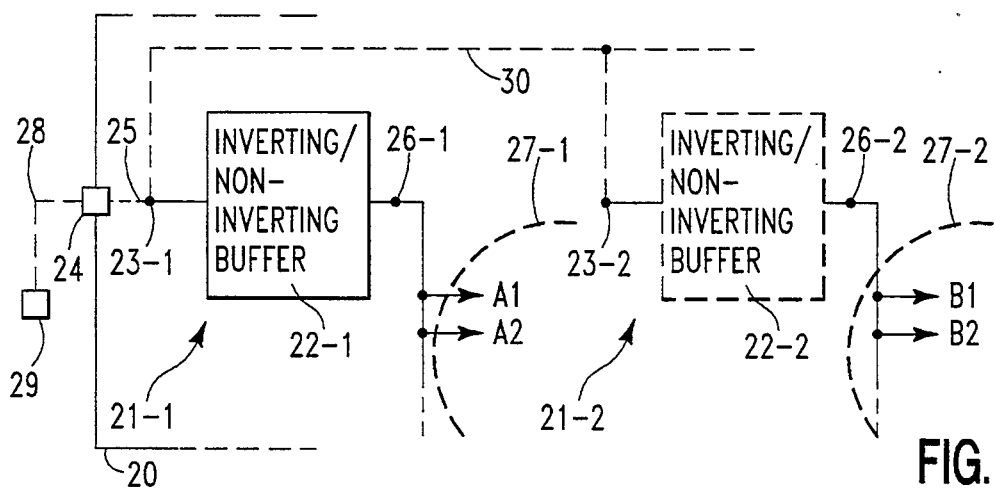
FIG. 2 is a schematical diagram of the logical implementation of a complex logic network and its associated tie-up (tie-down) circuit whose input terminal is connected to a primary input terminal of the chip according to the present invention.

FIG. 2, illustrates a portion of a semiconductor product logic chip 20 which includes a tie-up (tie-down) circuit and a complex logic network associated therewith. Tie-up (tie-down) circuit 21-1 consists of a non-inverting buffer book 22-1 and primary input 24 of the chip. Input terminal 23-1 of book 22-1 is connected to said primary input via connecting wire 25. The output terminal 26-1 of the non-inverting buffer book goes to the various nodes A1, A2, ... of a combinational/sequential logic network 27-1, wherever a tie-up (tie-down) function is required. Primary input terminal 24 is connected outside the chip via wiring connection 28 to a voltage supply means 29. Finally, to comply with any design system fan-out limitation, further tie-up (tie-down) circuits, assumed they are of the same type, can be added as appropriate, to implement a tie-up (tie-down) chain. This point is illustrated in FIG. 2 where an additional tie-up (tie-down) circuit 21-2 is added. Non-inverting buffer 22-2 has its input terminal 23-2 connected to the common primary input terminal 24 via connecting wire 30. Chains of tie-up and tie-down circuits can be thus implemented in a single chip, the only requirement would be to have the input terminals of all the tie-up circuits connected together to a first common primary input labelled 24, and the input terminals of all the tie-down circuits connected to a second common primary input 24. But, it is possible to have a single common primary input terminal for all tie-up and tie-down circuits of a same chip. For instance, it just suffices to have a direct connection between the common primary input and all the tie-up circuit input terminals wired together and to insert an inverter book between said common primary input terminal and all the tie-down circuit input terminals wired together.

Finally, it should also be noticed that the new tie-up (tie-down) circuit could have been constructed using an inverting book 22-1 rather than a non-inverting one with some advantages in terms of density, any of the two approaches being logically correct in all respects. It was decided to choose a non-inverting buffer book to facilitate the use of tie-up/tie-down circuits by the logic designer, since its output logic level is in phase with the primary input logic level.

Operation of a tie-up (tie-down) circuit reads as follows. For instance, let us assume for sake of illustration that circuit 21-1 is a tie-up circuit. According to the basic principles of the present invention, in normal operating conditions, i.e. in SYSTEM mode, the input terminal 23-1 of the non-inverting buffer 22-1 is set to a logic "1", because in this mode, the voltage supply means 29 makes a direct connection of primary input terminal 24 to VDD. A steady "1" logic level or state is thus generated on the output terminal 26-1 that is common to tie-up circuit 21-1 and non-inverting buffer 22-1. A tie-up function is then available to be delivered to the associated logic network 27-1.

During the TEST mode, the supply voltage means 29 consists of the test pattern generator of the tester, and to that end, there is a direct connection between primary input 24 and the appropriate tester output terminal. As a result, the input terminal 23-1 of the tie-up circuit 21-1 follows the test stimuli sequence generated by the the tester generator as standard, and thus is free to switch from 1 to 0 and conversely, to allow the tester to detect all the stuck-at faults. In this-TEST mode, the tie-up function is not realized since the output terminal 26-1 of the tie-up circuit 21-1 may be alternatively set at the "0" and "1" logic levels during the test stimuli sequence. Consequently the behavior of tie-up circuit 21-1 is very different depending on it operates either in the TEST or in the SYSTEM mode.

The same principle also applies to a tie-down circuit when a tie-down function is required.

The tie-up (tie-down) circuit 21-1 of FIG. 2 can be implemented in a great variety of manners. A tie-up version of the non-inverting buffer book 22-1 in CMOS technology is shown in FIG. 3A. Now turning to FIG. 3A, this CMOS tie-up version referenced 22-11 is built from two CMOS inverters 31 and 32 connected in series. The size of the FET devices of inverter 31 is designed to assure the driving capability of the second inverter 32, while keeping the input capacitance as low as possible. According to a significant feature of the present invention, the size of PFET device P2 of second inverter 32 must accommodate the high fan-out of the tie-up book 22-11 and is largely dimensioned. The same construction applies to the CMOS tie-down version referenced 22-12 of the non-inverting buffer book 22-1 which is shown in FIG. 3B. As apparent from FIG. 3B, it is NFET device N'2 of the second inverter 32'(connected to GND) which has now the biggest size.

The level of testability attained when using this technique of the present invention on the area impacted by the tie-up/tie-down circuits is of 100% without SPQL degradation in a stuck-at fault model scheme. The known techniques described above which implement conventional tie-up/down circuits, show a much lower testability degradation (50%) for the logic networks associated therewith when compared to the first approach or full testability (all faults were ignored) but at the cost of an obvious SPQL quality degradation.

The advantages resulting of using the tie-up/tie-down circuits of the present invention are listed hereinbelow:

With respect of the first approach:
The logic designer would no more see the testability degradation of the logic network impacted by the tie-up/down functions.
No logic circuitry needs to be added during testability runs. Thus, in using this kind of tie-up/down circuits of the present invention, it is possible to get better density in avoiding additional latches and logic circuits. Moreover, design/debug time can be saved.
All inputs of the chip are fixed in the original design. As a result, no modification have to be done in the test case files for the logic simulation at the validation time.

The logic synthesis tools can use this kind of circuit. No high skills in testability are required.

With respect to the second approach:

These circuits and this kind of technique allow to reach the Market Driven Quality (MDQ) concept, like robust design, without wasting time in unnecessary debug and reruns.

The SPQL will be improved.

We claim:

1. A semiconductor product logic chip (20) including a tie-up circuit (21-1) adapted to feed a logic network (27-1) having two standard operating modes, said modes being a SYSTEM and a TEST mode, said semiconductor product logic chip comprising:
   an non-inverting buffer book (22-1) consisting of two serially connected CMOS inverters (31,32) and provided with an input terminal (23-1) and an output terminal (26-1);
   a chip primary input terminal (24) connected to a primary input supply means (29) adapted to supply a VDD supply voltage, i.e. logic level "138, during the SYSTEM mode and to selectively switch between the VDD supply voltage and a GND supply voltage, i.e. between the "1" and "0" logic levels, whenever desired in the TEST mode;
   a connection (25) between said input terminal and said primary input terminal; and,
   at least one logic network (27-1) connected to said output terminal.

2. The tie-up circuit of claim 1 wherein a P device (P2) of the second inverter (32) has a large size compared to a P device (P1) of the first inverter (31) to accommodate the fan-out of the tie-up circuit.

3. A semiconductor product logic chip (20) including a tie-down circuit (21-1) adapted to feed a logic network (27-1) having two standard operating modes, said modes being a SYSTEM mode and a TEST mode, said semiconductor product logic chip comprising: p1 an non-inverting buffer book (22-1) consisting of two serially connected CMOS inverters (31', 32') and provided with an input terminal (23-1) and an output terminal (26-1);
   a chip primary input terminal (24) connected to a primary input supply means (29) adapted to supply a GND supply voltage, i.e. logic level "0", during the SYSTEM mode and to selectively switch between a VDD supply voltage and the GND supply voltages, i.e. between the "0" and "1" logic levels, whenever desired in the TEST mode;
   a connection (25) between said input terminal and said primary input terminal; and,
   at least one logic network (27-1) connected to said output terminal.

4. The tie-down circuit of claim 3 wherein a N device (N'2) of the second inverter (32') has a large size compared to a N device (N'1) of the first inverter (31') to accommodate the fan-out of the tie-down circuit.

* * * * *